(12) United States Patent
Ito

(10) Patent No.: US 7,569,455 B2
(45) Date of Patent: Aug. 4, 2009

(54) MANUFACTURING METHOD OF SEMICONDUCTOR DEVICE

(75) Inventor: Takayuki Ito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/923,467

(22) Filed: Oct. 24, 2007

(65) Prior Publication Data
US 2008/0102574 A1    May 1, 2008

(30) Foreign Application Priority Data
Oct. 25, 2006    (JP) ............................. 2006-289961

(51) Int. Cl.
*H01L 21/336* (2006.01)
(52) U.S. Cl. .................. 438/299; 438/199; 438/301
(58) Field of Classification Search .............. 438/299, 438/301, 303, 305, 306, 296, 231, 232, 199, 438/294, 230, 218, 154, 163, 933; 257/E21.634, 257/213, 288, 327, 368, 369
See application file for complete search history.

(56) References Cited

U.S. PATENT DOCUMENTS

| | | | |
|---|---|---|---|
| 6,551,870 B1 * | 4/2003 | Ling et al. ................. | 438/217 |
| 6,632,718 B1 * | 10/2003 | Grider et al. .............. | 438/305 |
| 7,157,340 B2 * | 1/2007 | Ito et al. ................... | 438/301 |
| 2001/0041432 A1 * | 11/2001 | Lee ........................... | 438/530 |
| 2005/0263835 A1 * | 12/2005 | Sakama et al. ........... | 257/411 |
| 2006/0073665 A1 * | 4/2006 | Jain .......................... | 438/303 |
| 2006/0199346 A1 | 9/2006 | Jain | |

FOREIGN PATENT DOCUMENTS

| | | |
|---|---|---|
| JP | 2004-63574 | 2/2004 |
| JP | 2005-5406 | 1/2005 |
| JP | 2006-278532 | 10/2006 |

* cited by examiner

*Primary Examiner*—Kevin M Picardat
(74) *Attorney, Agent, or Firm*—Finnegan, Henderson, Farabow, Garrett & Dunner, L.L.P.

(57) ABSTRACT

A manufacturing method of a CMOS semiconductor device includes using, in an nMOS, spike RTA (first annealing) together with ultra-rapid rising/falling temperature annealing (second annealing) whose temperature increase/decrease rate is higher than that of the spike RTA, and applying the ultra-rapid rising/falling temperature annealing (second annealing) alone in a pMOS, when activating a shallow source/drain extension region.

18 Claims, 8 Drawing Sheets

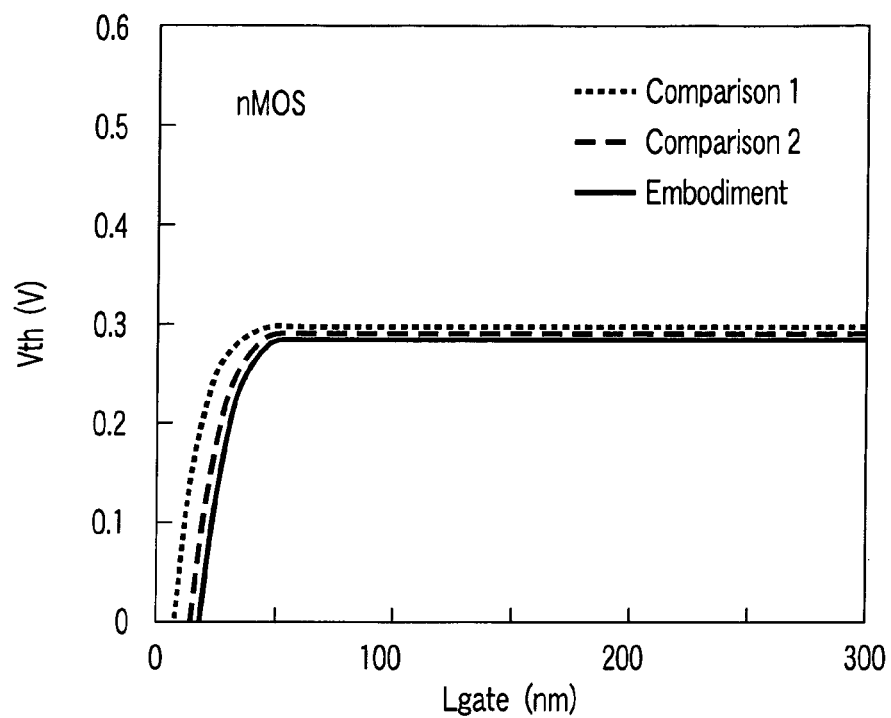
F I G. 2
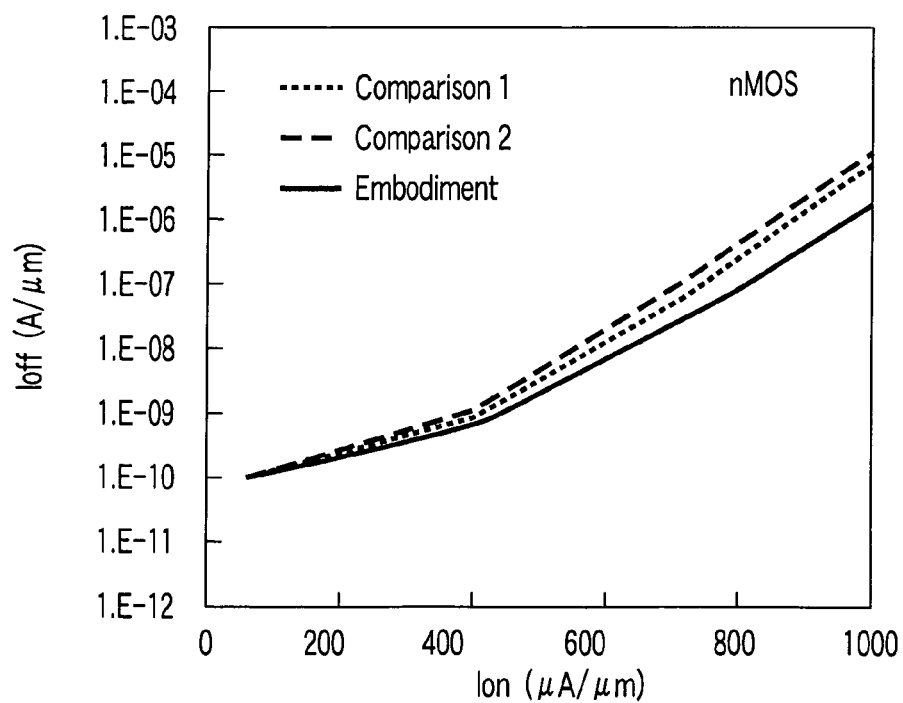
F I G. 3

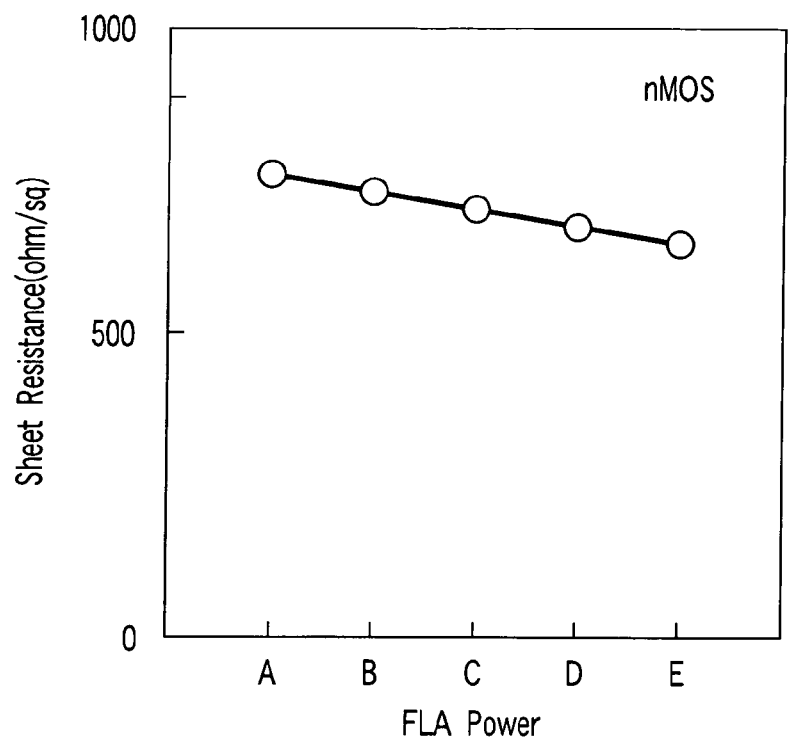
F I G. 6
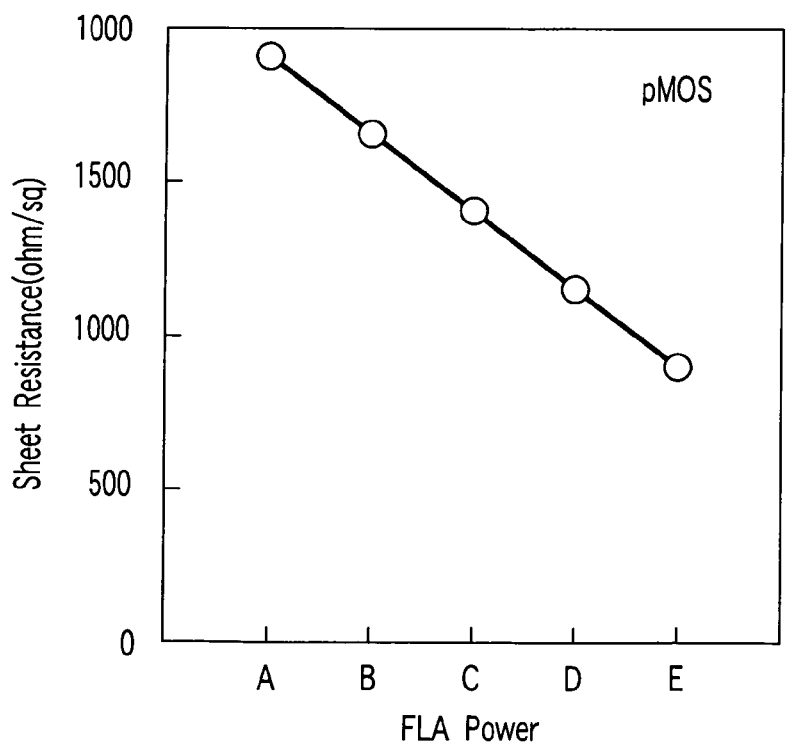
F I G. 7

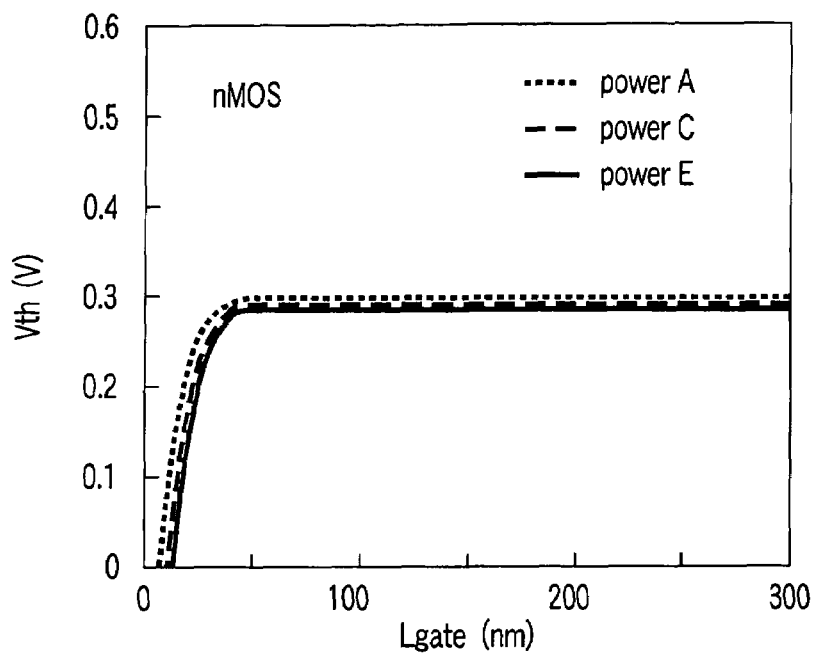
F I G. 8
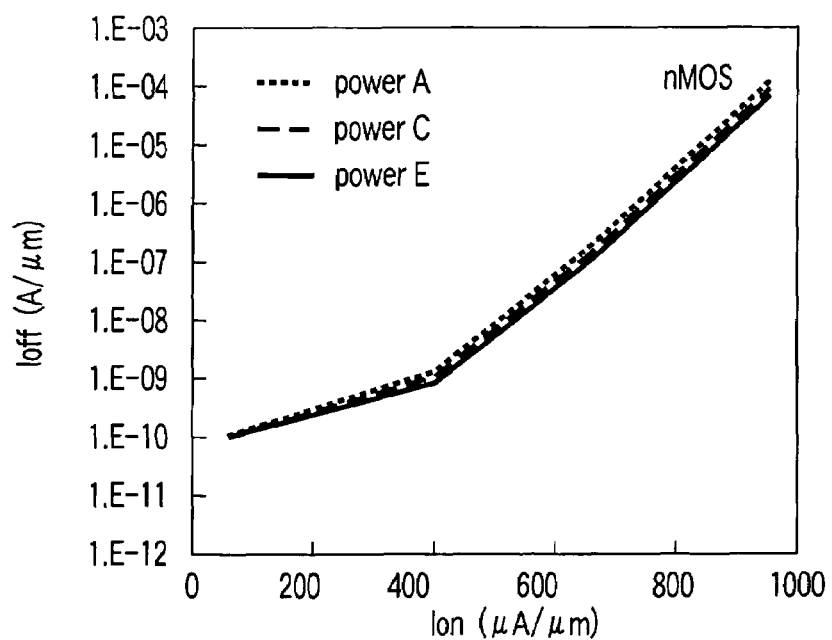
F I G. 9

MANUFACTURING METHOD OF SEMICONDUCTOR DEVICE

CROSS-REFERENCE TO RELATED APPLICATIONS

This application is based upon and claims the benefit of priority from prior Japanese Patent Application No. 2006-289961, filed Oct. 25, 2006, the entire contents of which are incorporated herein by reference.

BACKGROUND OF THE INVENTION

1. Field of the Invention

The present invention relates to a manufacturing method of a semiconductor device having a pMOS and an nMOS to activate an impurity implantation region at a high concentration, and to form a gate electrode with a reduced gate leakage current.

2. Description of the Related Art

In the miniaturization of a MOSFET, parasitic resistance and a short channel effect increase along with a reduction in the dimensions of elements, and it is therefore important to form a shallow source/drain region with low resistance. While impurities have to be adequately activated in order to reduce the resistance of an impurity diffusion region, the impurities diffuse due to annealing for activation, so that high-temperature and ultra-rapid annealing is required.

An annealing technique using a flash lamp in which an inert gas such as xenon (Xe) is sealed or using a laser has been considered as means for instantaneously supplying the heat energy necessary for the activation (e.g., refer to Jpn. Pat. Appln. KOKAI Publication No. 2004-63574). These light sources are capable of generating light at a pulse width of a millisecond order, and can therefore activate implanted impurity atoms with little diffusion. Irradiating light energy can be increased to considerably reduce the resistance of a diffusion layer and recover from (e.g., eliminate, remedy) ion implantation defects, such that an improvement in the driving force of the MOSFET can be expected.

However, due to characteristics that enable the instantaneous supply of high heat energy, polysilicon on a gate insulating film easily reaches a high temperature because it does not easily release heat. This leads to a problem that impurities contained in the polysilicon gate diffuse before the heat energy is adequately supplied to a monocrystalline silicon substrate, and the impurities infiltrate into the gate insulating film and deteriorate the breakdown voltage.

One solution to this problem is a method which reduces the amount of impurities ion-implanted into polysilicon. However, a capacitance is formed due to depletion at the bottom of the polysilicon gate, which entails the risk of an increase in the thickness of the effective gate insulating film. That is, there is a trade-off relation between the high-concentration activation of the source/drain region and the suppression of a gate leakage current, and therefore existing ultra-rapid optical annealing techniques have a problem of being unable to ensure a process window in a semiconductor device manufacturing process.

There has therefore been a desire for the provision of a high-efficiency semiconductor device manufacturing method capable of activating impurities implanted in a gate electrode and a semiconductor substrate at a high concentration without increasing a gate leakage current, and which is also capable of expanding a process window in a semiconductor device manufacturing process.

BRIEF SUMMARY OF THE INVENTION

According to one aspect of the invention, there is provided a method of manufacturing a semiconductor device, which includes:

forming an n-type well and a p-type well on a semiconductor substrate;

enclosing the upper ends of the n-type well and the p-type well with an isolation film;

forming a gate insulating film on the n-type well and the p-type well enclosed with the isolation film;

forming gate electrodes on the gate insulating film of the n-type well and the p-type well;

forming first sidewall insulating films on the sidewalls of the gate electrodes;

forming a first source/drain extension region and a second source/drain extension region on the upper surfaces of the n-type well and the p-type well using the gate electrodes and the first sidewall insulating films as masks;

ion-implanting n-type impurities into the p-type well alone masking the n-type well with a first film after removing the first sidewall insulating films in order to form a third source/drain extension region shallower than the first source/drain extension region;

carrying out first annealing having a first temperature increase/decrease rate after removing the first film;

masking the p-type well with a second film and ion-implanting p-type impurities into the n-type well after carrying out the first annealing in order to form a fourth source/drain extension region shallower than the second source/drain extension region; and carrying out second annealing having a second temperature increase/decrease rate higher than the first temperature increase/decrease rate after removing the second film.

BRIEF DESCRIPTION OF THE SEVERAL VIEWS OF THE DRAWING

FIG. 2 is a Vth Roll-off characteristic diagram of an nMOS comparing Embodiment with Comparisons 1 and 2;

FIG. 3 is an Ion-Ioff characteristic diagram of the nMOS comparing Embodiment with Comparisons 1 and 2;

FIG. 6 is a characteristic diagram showing the relation between flash lamp irradiation energy and the sheet resistance of a source/drain extension region with regard to the nMOS;

FIG. 7 is a characteristic diagram showing the relation between flash lamp irradiation energy and the sheet resistance of the source/drain extension region with regard to the pMOS;

FIG. 8 is a diagram showing the relation (Roll-off characteristic) between Lgate and Vth when the flash lamp irradiation energy is changed, with regard to the nMOS;

FIG. 9 is an Ion-Ioff characteristic diagram when the flash lamp irradiation energy is changed, with regard to the nMOS;

DETAILED DESCRIPTION OF THE INVENTION

An embodiment of the present invention will hereinafter be described with reference to the drawings. FIGS. 1A to 1M are sectional views showing, stepwise, a process of manufacturing a CMOS transistor according to the embodiment of the present invention.

Figure 1A:
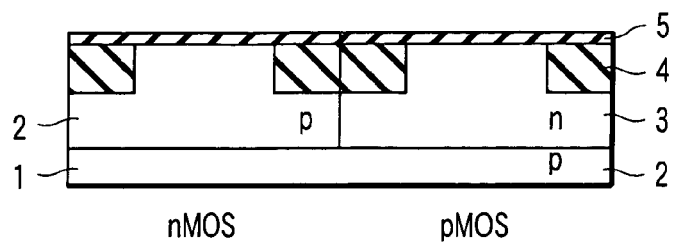
FIGS. 1A to 1M are diagrams showing, stepwise, a process of manufacturing a MOSFET according to one embodiment of the present invention.

First, as shown in FIG. 1A, a p-well 2 is formed in an n-MOS region of a p-type silicon substrate 1, and an n-well 3 is formed in a p-MOS region. Isolation regions 4 are formed around the p-well 2 and around the n-well 3, and desired impurities are ion-implanted into parts corresponding to channel parts for electrical activation. Then, a silicon oxide film $SiO_2$ or silicon oxynitride film SiON (surface N concentration <15%) serving as a gate insulating film 5 is formed on the surface of the silicon substrate 1.

Figure 1B:
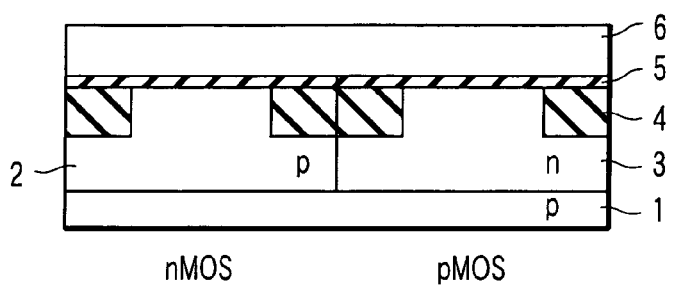

Then, as shown in FIG. 1B, polysilicon or polysilicon germanium (SiGe) (Ge concentration at 10 to 30%) is deposited on the gate insulating film 5 to a thickness of 50 nm to 150 nm by a low pressure chemical vapor deposition (LPCVD) method, thereby forming a polycrystalline layer 6.

Figure 1C:
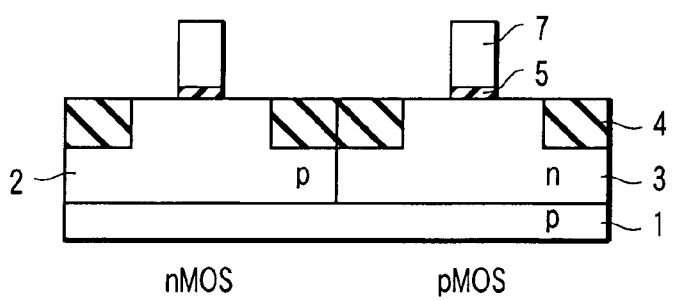

Then, although not shown, group V atoms such as phosphorus (P) or arsenic (As) serving as n-type impurities are ion-implanted into the n-MOS region to reach a concentration of $10^{20}/cm^3$ or more using a resist as a mask. Further, group III atoms such as boron (B) serving as p-type impurities are ion-implanted into the p-MOS region to reach a concentration of $10^{20}/cm^3$ or more using an unshown resist as a mask. Subsequently, as shown in FIG. 1C, the polycrystalline layer 6 is selectively processed by a reactive ion etching (RIE) method to form gate electrodes 7.

Figure 1D:
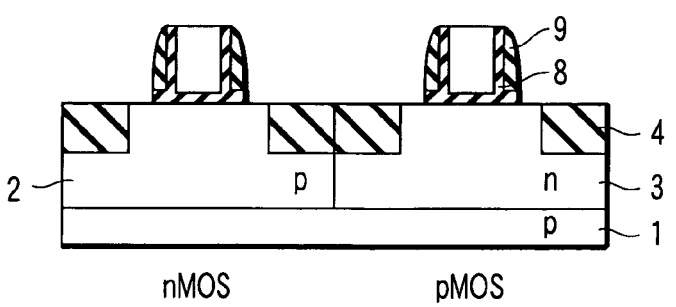

Then, a silicon oxide ($SiO_2$) film 8 and a silicon nitride ($Si_3N_4$) film 9 are deposited at a thickness of, for example, 4 nm within a range of about 2 to 10 nm by the LPCVD method at 60° C. or less. The silicon oxide film and the silicon nitride film are etched by a pattern forming process using sidewall spacers and RIE, and selectively left on the sidewalls of the gate electrode 7 and the gate insulating film 5. Thus, first sidewall insulating films (spacers) 8 and 9 as shown in FIG. 1D are formed.

Then, although not shown, the surface of the n-well 3 is masked with a photoresist film, and the gate electrode 7 and the sidewall spacers 8 and 9 are used as masks, so that group V atoms such as arsenic (As) serving as n-type impurities are ionized and ion-implanted into the surface of the p-type well layer 2. Conditions of the ion implantation include an acceleration energy of 15 eV and a dose of $3\times10^{15}/cm^2$.

In the same manner, after the removal of the photoresist film, the surface of the p-type well layer 2 is masked with a photoresist film (not shown), and the gate electrode 7 and the sidewall spacers 8 and 9 are used as masks, so that group III atoms such as boron (B) serving as p-type impurities are ionized and ion-implanted into the surface of the n-type well layer 3. Conditions of the ion implantation include an acceleration energy of 2 keV and a dose of $3\times10^{15}/cm^2$.

Figure 1E:
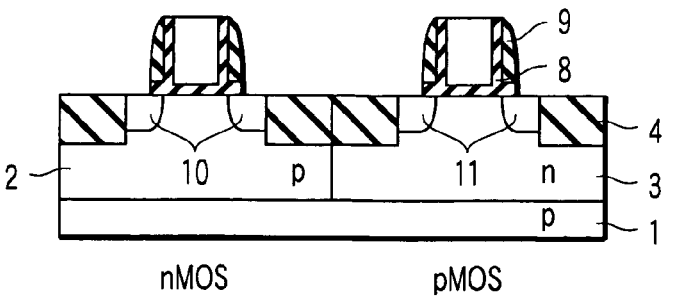

Thus, first source/drain impurity regions 10 and 11 as shown in FIG. 1E which are separate from the ends of the gate electrodes 7 and which are in contact with the isolation regions 4 are formed in the p-well 2 and the n-well 3. Moreover, owing to the above ion implantations, corresponding impurity ions are also implanted into the gate electrode 7. Primary conductivity type impurities (P or As in the n-MOS, and B in the p-MOS) are finally contained in the gate electrode at about $5\times10^{15}$ to $1\times10^{16}/cm^2$.

Then, a halogen lamp is used as a heat source to carry out an activation annealing treatment (spike RTA) on the silicon substrate 1. The spike RTA treatment is carried out at 1000° C. or more and 1050° C. or less. This activation annealing treatment permits the impurities implanted into the gate electrode 7 to diffuse into an interface with the gate insulating film 5, and permits crystal defects produced in the silicon substrate 1 due to the ion implantation to be eliminated.

Figure 1F:
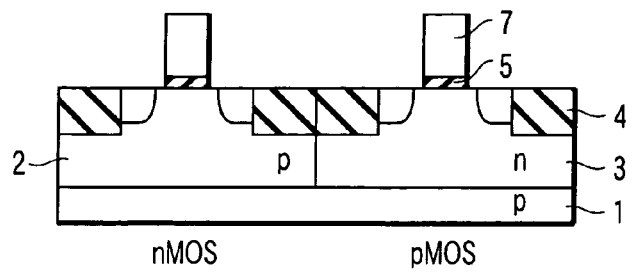
Figure 1G:
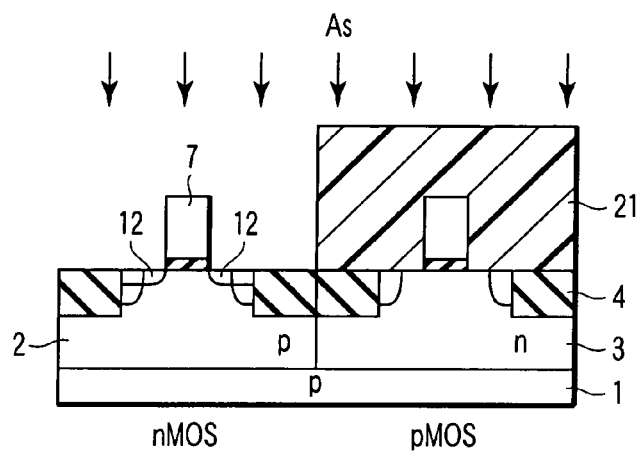

Then, as shown in FIG. 1F, hot phosphoric acid and hydrofluoric acid are used to remove the sidewall spacers formed with the silicon nitride film 9 and the silicon oxide film 8. Further, as shown in FIG. 1G, the p-MOS region is masked with a photoresist film 21, and the gate electrode 7 in the n-MOS region is used as the mask, so that group V atoms such as arsenic As serving as n-type impurities are ionized and ion-implanted into the surface of the p-type well layer 2. Conditions of the ion implantation include, for example, an acceleration energy of 1.5 keV and a dose of $1\times10^{15}/cm^2$.

Figure 1H:
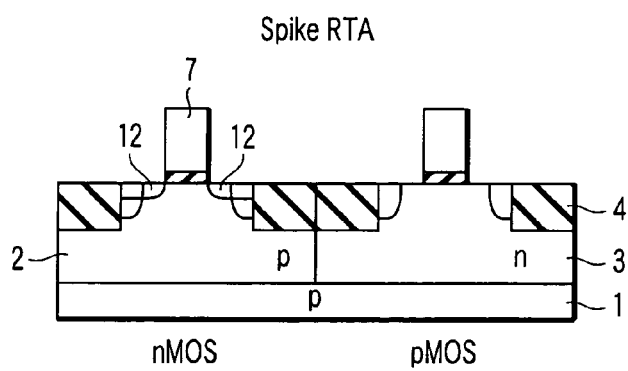
Figure 1I:
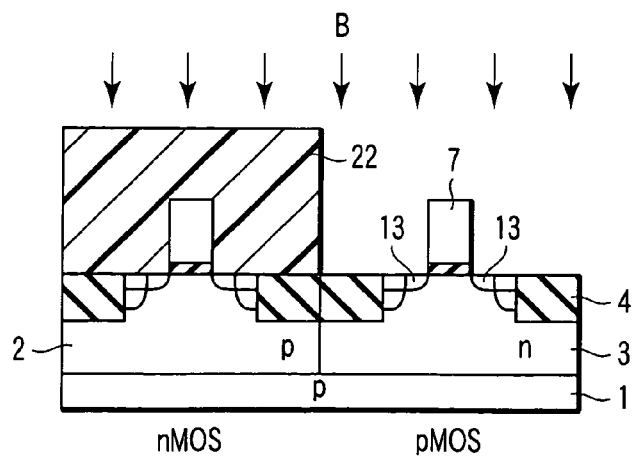
Figure 1J:
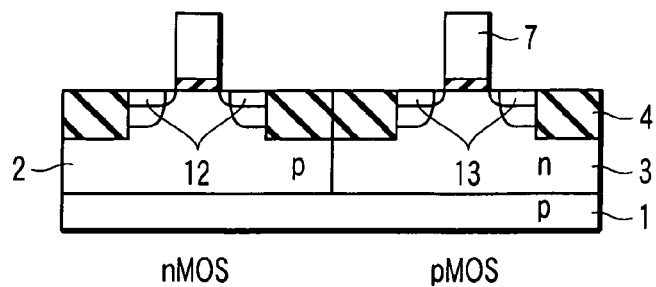

After the removal of the photoresist film 21, spike rapid thermal annealing (first annealing) is carried out at a temperature increase/decrease rate of 100° C./second or more, and at a maximum attained temperature of 900° C. or more and 1050° C. or less, for example, 1000° C., as shown in FIG. 1H. Further, as shown in FIG. 1I, the surface of the p-type well layer 2 is masked with a photoresist film 22, and the gate electrode 7 is used as a mask, so that group III atoms such as B serving as n-type impurities are ionized and ion-implanted into the surface of the n-type well layer 3. Conditions of the ion implantation include, for example, an acceleration energy of 0.3 keV and a dose of $1\times10^{15}/cm^2$. Thus, shallow (e.g., a depth of 20 nm or less) source/drain extension impurity regions 12 and 13 adjacent to the gate electrodes 7 and the isolation regions 4 as shown in FIG. 1J are formed in the silicon substrate 1.

Figure 1K:
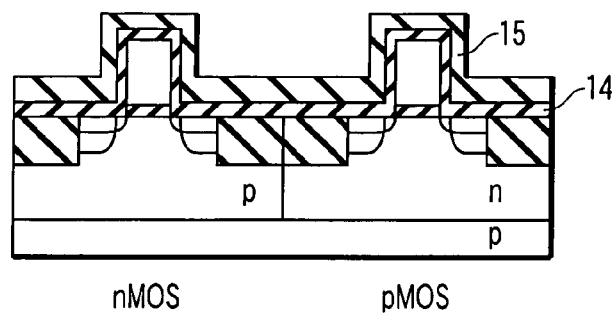
Figure 1L:
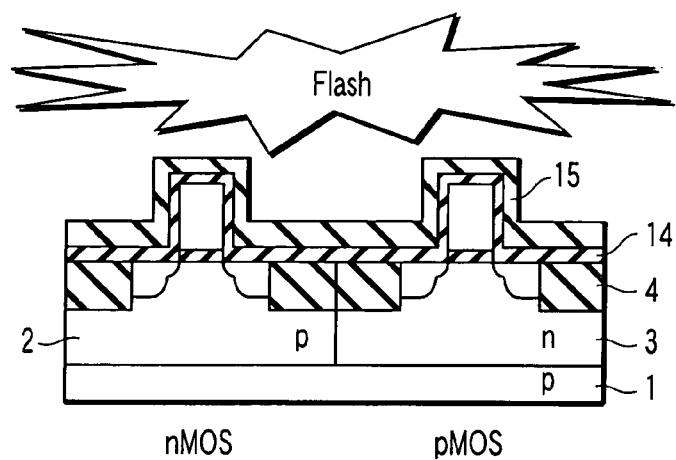

Then, as shown in FIG. 1K, a silicon oxide film 14 and a silicon nitride film 15 are sequentially deposited by the LPCVD method at a film formation temperature of 600° C. or less. Further, as shown in FIG. 1L, a flash lamp with a temperature increase/decrease rate of $10^{5}$° C./s or more and a maximum attained temperature of 1100° C. or more and 1400° C. or less is used as a heat source to carry out second annealing for activation (ultra-rapid rising/falling temperature annealing). In this annealing treatment, the silicon substrate 1 is heated from its front side by light radiated from the flash lamp light source while the silicon substrate 1 is being heated (auxiliary heating) from its rear side.

The temperature of the auxiliary heating of the silicon substrate 1 in this case preferably ranges from about 400° C. or more and 900° C. or less. An extremely low auxiliary heating temperature is not preferable because high light intensity is required to heat from the surface, which increases heat stress produced inside the silicon substrate 1 and induces crystal defects such as a slip or dislocation. On the other hand, an extremely high auxiliary heating temperature is not preferable either because impurities diffuse. For example, a hot plate, a halogen lamp or an arc lamp can be used as auxiliary heating means.

The irradiation with the flash lamp light is typically carried out by one emission (one pulse) using, for example, a xenon flash lamp. The duration of the pulse desirably has a full width at half maximum of about 0.1 ms or more and 100 ms or less. A shorter pulse width is not preferable because heating is performed more instantaneously and heat stress produced in the surface of the silicon substrate 1 increases. A longer pulse width is not preferable either because impurities diffuse.

The xenon flash lamp light irradiating from above the surface of the silicon substrate 1 penetrates an insulating film formed with the silicon nitride film 15 and the silicon oxide film 14, and is absorbed by the gate electrode 7, the source/drain extension regions 12 and 13 within the silicon substrate 1, and the source/drain impurity regions 10 and 11. Temperature increases in the gate electrode 7, the extension regions 12 and 13 and the source/drain impurity regions 10 and 11 which have absorbed the xenon flash lamp light. The temperature in the gate electrode 7, the extension regions 12 and 13 and the source/drain impurity regions 10 and 11 is considered to instantaneously exceed 1200° C., and the impurities implanted in the gate electrode 7, the extension regions 12 and 13 and the source/drain impurity regions 10 and 11 are electrically activated by this temperature. This activation decreases the resistance in the gate electrode 7, the extension regions 12 and 13 and the source/drain regions 10 and 11. The difference between the refractive indices of an atmosphere layer and the silicon substrate 1 can be decreased by carrying out the annealing with the flash lamp via the silicon oxide film 14 and the silicon nitride film 15, so that the thickness of the insulating films can be adjusted to decrease the reflectance at the interface of the silicon substrate. Moreover, as both the silicon oxide film and the silicon nitride film are optically transparent films, heating efficiency is not lost and the reflectance is decreased, which makes it possible to raise the heating temperature with less irradiation energy.

Figure 1M:
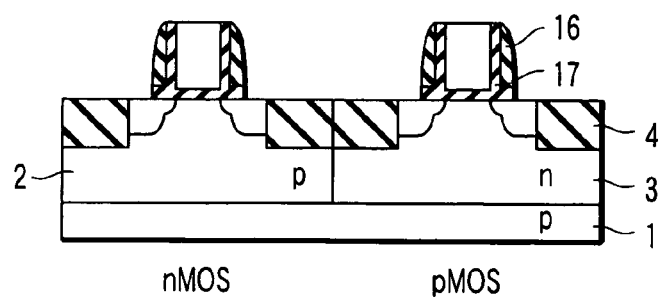

Then, the silicon nitride film 15 and the silicon oxide film 14 are etched and selectively left on the sidewall of the gate electrodes 7. This forms a sidewall spacer of a stacked structure comprising a silicon oxide film 16 and a silicon nitride film 17 as shown in FIG. 1M. The thickness of the insulating film finally serving as the sidewall spacer is set at 20 nm or more and 60 nm or less, including the thickness of the silicon oxide film 16 and the silicon nitride film 17. This sidewall spacer serves to prevent the reaction of metal silicide in the subsequent process, and the basic structure of a semiconductor device according to the embodiment is completed.

The manufacturing process after FIG. 1M is not specifically shown, but in the process of forming salicide, one of an Ni film, Co film, Pt film or Pd film of 10 nm or less, or a metal film mainly containing an alloy of these metals is deposited to selectively form salicide (NiSi, $NiSi_2$, CoSi, $CoSi_2$, PtSi or $Pd_2Si$) in the part where Si or SiGe is exposed.

Then, although not shown, a silicon oxide film serving as an interlayer insulator is deposited, and a contact hole is made therein. Wiring lines are connected to the gate electrode 7 and the source/drain regions 10 and 11 via the contact hole. In this manner, a semiconductor device including a MOS structure with a shallow extension impurity region of 20 nm or less is completed.

Next, Embodiment as a specific example of the present invention is compared with Comparative Examples.

EMBODIMENT

As described above, As is ion-implanted in a pMOS formation region in a process of forming shallow source/drain extension impurity regions in FIG. 1G, and then a spike rapid thermal annealing (RTA) treatment (first annealing) is carried out at a temperature of 1000° C. before B is ion-implanted in an nMOS formation region (FIG. 1H).

[Comparison 1]

The spike RTA treatment as shown in FIG. 1H is not carried out after the process of forming the shallow source/drain extension impurity regions in FIG. 1G.

[Comparison 2]

B is ion-implanted in the pMOS formation region in the process of forming the shallow source/drain extension impurity regions in FIG. 1G. The spike RTA in FIG. 1H is skipped. Then, after As is ion-implanted in the nMOS formation region in FIG. 1I, the spike RTA treatment is carried out at a temperature of 1000° C.

Figure 4:
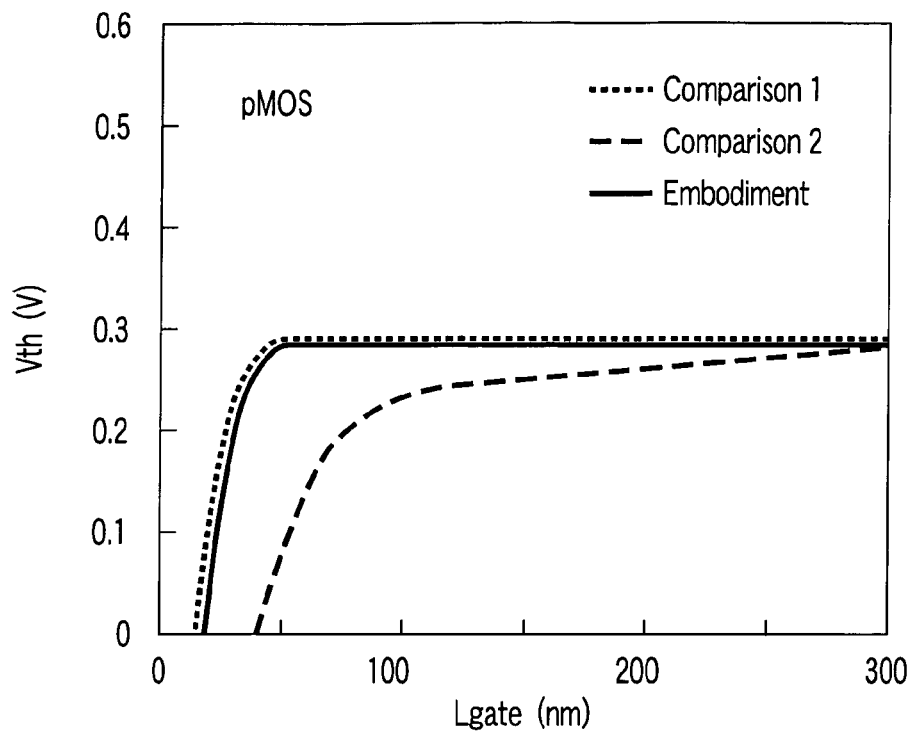
FIG. 4 is a Vth Roll-off characteristic diagram of a pMOS comparing Embodiment with Comparisons 1 and 2.
Figure 5:
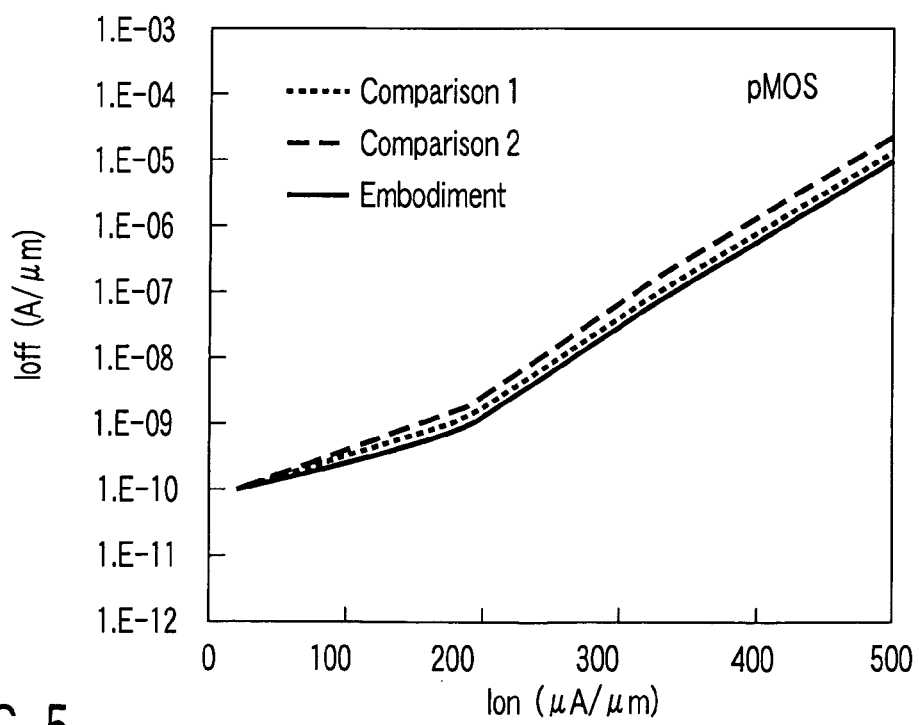
FIG. 5 is an Ion-Ioff characteristic diagram of the pMOS comparing Embodiment with Comparisons 1 and 2.
Figure 10:
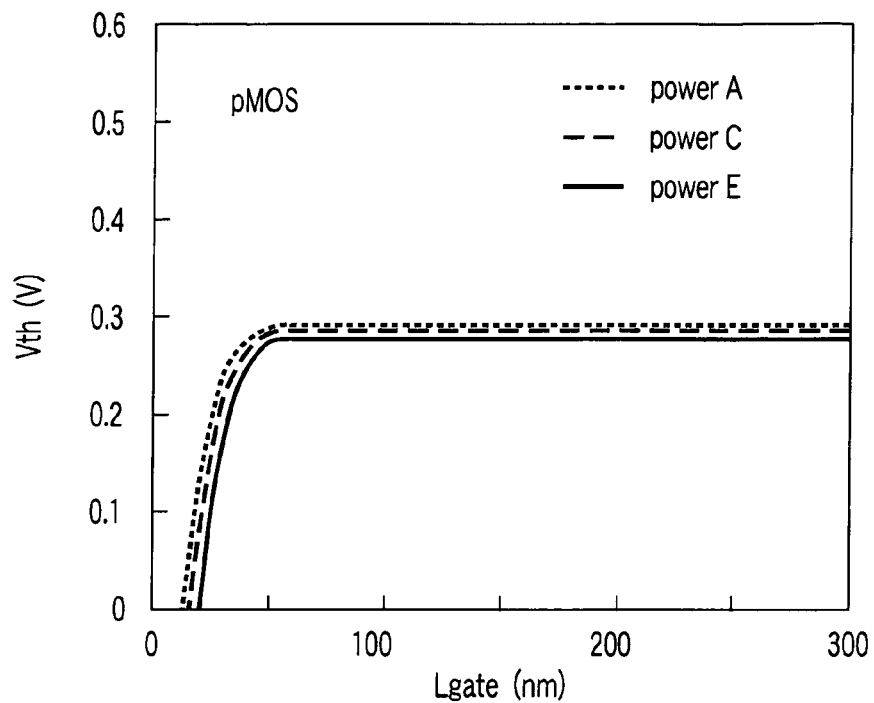
FIG. 10 is a diagram showing the relation (Roll-off characteristic) between Lgate and Vth when the flash lamp irradiation energy is changed, with regard to the pMOS.

Electric characteristics (a Vth Roll-off characteristic and an Ion-Ioff characteristic) of MOSFETs formed in the methods of Embodiment and Comparisons 1 and 2 are shown in FIG. 4 (nMOS) and FIG. 5 (pMOS). Here, the Vth Roll-off characteristic indicates the relation between a gate length (Lgate) and a threshold voltage Vth, wherein the threshold voltage rises in the region with a small gate length, and flattens to a normal value at an inflection point (roll-off). An inflection point appearing at a small gate length means good characteristics. Further, the Ion-Ioff characteristic indicates the relation between a drain current (Ion) during gate-on and a drain current (leakage current, Ioff) during gate-off, and a lower Ioff and a higher Ion, that is, a lower leakage current and a gentler curve mean a good transistor with great driving force.

With regard to the roll-off characteristic, there is no great difference between Embodiment and Comparisons concerning the nMOS as understood from FIG. 2. However, in the case of the pMOS, Embodiment is better than Comparison 2 as understood from FIG. 4, and it is apparent that Embodiment is better as a whole. With regard to the Ion-Ioff characteristic, a higher on-current can be obtained in Embodiment both in the nMOS and pMOS as understood from FIGS. 3 and 5, which proves that a good transistor with great driving force can be formed.

Next, the reason for the improvement of the driving force in Embodiment is considered below.

FIGS. 6 and 7 show the dependency of the sheet resistance of the source/drain extension region on flash lamp irradiation energy (FLA power) with regard to the nMOS and the pMOS. It is understood from FIG. 6 that the dependency of the sheet resistance on the irradiation energy is small in the case of the nMOS. In the nMOS, the Ion indicating the driving force hardly changes with the irradiation energy (power A, B(>A), C(>B)) as shown in FIG. 9, which may reflect the result of a slight decrease of parasitic resistance. The irradiation energy can be further increased to reduce the parasitic resistance of the source/drain extension to a level that influences the driving force, in which case impurities (As or P) in gate polysilicon diffuse into the gate insulating film and form leakage paths, leading to an increase in a gate leakage current.

On the other hand, in Embodiment, the spike RTA (first annealing) is carried out immediately before the process of the flash lamp annealing (second annealing) such that the impurities in gate polysilicon more uniformly diffuse to its bottom. Moreover, the flash lamp annealing (second annealing) with a temperature increase/decrease rate higher than that of the spike RTA is carried out as additional annealing, which is considered to uniformly activate the gate electrode at a high concentration and suppress gate depletion.

Gate polysilicon has a grain boundary and therefore has a diffusion coefficient greater than that of a monocrystalline substrate, so that taking much time permits diffusion through the grain boundary even at a low temperature. That is, it is possible to suppress the gate depletion as well as the diffusion of impurities in the source/drain extension region into the substrate.

In Embodiment, it is considered that a reduced thickness of the apparent gate insulating film increases gate capacity on an inversion layer (channel) side such that the driving force is improved. The flash lamp annealing can also cause the diffusion of the impurities in the source/drain extension region by increasing the irradiation energy, but cannot cause the uniform diffusion due to its short duration. Instead, this causes the diffusion of the impurities in gate polysilicon immediately on the gate insulating film. This more likely leads to the fluidization or local thickness reduction of the gate insulating film or to the formation of pin holes, resulting in the increase of the gate leakage current. In the ultra-rapid rising/falling temperature annealing, it is considered that, in spite of its short duration, the control of the diffusion into the gate insulating film is difficult under a high-temperature condition.

Figure 11:
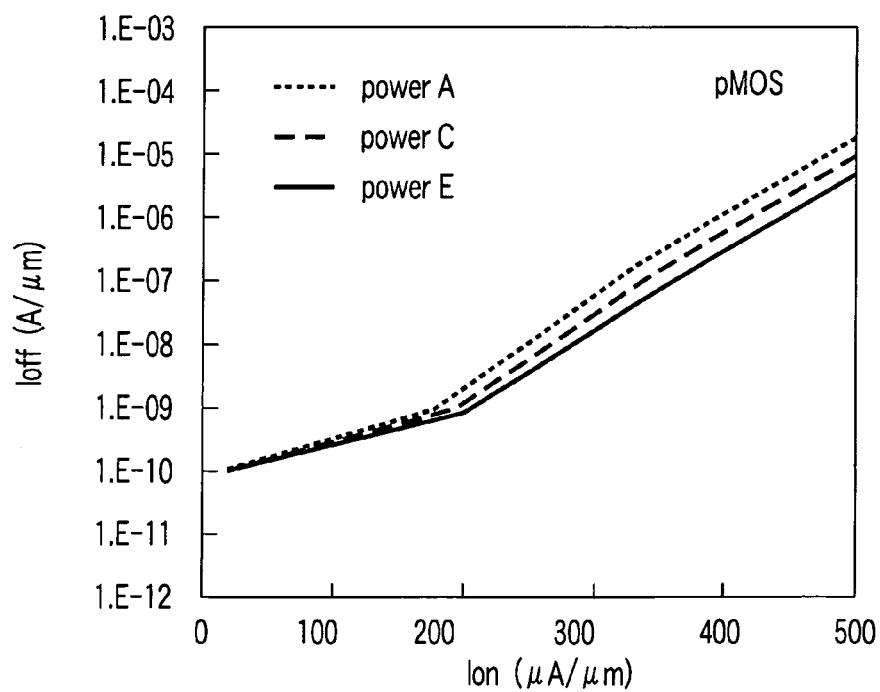
FIG. 11 is an Ion-Ioff characteristic diagram when the flash lamp irradiation energy is changed, with regard to the pMOS.

On the other hand, as shown in FIG. 7, it is apparent that the dependency of the sheet resistance on the irradiation energy is great in the case of the pMOS. In the pMOS, as shown in FIG. 11, the curve becomes gentler with the increasing FLA powers A, C and E, which may reflect the result of the decrease of the parasitic resistance. That is, the dependency of the driving force Ion on the irradiation energy is great. However, when the spike RTA is used together for the PMOS, B in the source/drain extension region diffuses due to a higher diffusion coefficient of B than that of As, such that the Vth Roll-off characteristic significantly deteriorates (Comparison 2 in FIG. 4 corresponds to this). That is, it is difficult in the pMOS to introduce the spike RTA process after the formation of the source/drain extension region in contrast with the nMOS.

As described above, the spike RTA (first annealing) is used together with the ultra-rapid rising/falling temperature annealing (second annealing) only for the nMOS in Embodiment. Thus, even if a high concentration of impurities is present in gate polysilicon, the irradiation energy can be suppressed to suppress the diffusion and infiltration of the impurities into the gate insulating film, so that the formation of leakage paths is not easily caused. On the other hand, it is possible to recover from crystal defects and increase an activation concentration even with the same concentration of impurities in gate polysilicon, such that the driving force can be improved to the extent that does not increase the gate leakage current.

That is, according to Embodiment, it is possible to stably achieve a process of activating the impurity region with a wide process window and easily manufacture a micro high-performance transistor.

In addition, while an annealing unit using a xenon flash lamp as a source of irradiating light has been explained in the embodiments described above, the present invention is not limited thereto, and is also applicable to a light source such as flash lamps using, for example, other inert gases, mercury and hydrogen, or an arc discharge lamp, excimer laser, Ar laser, $N_2$ laser, YAG laser, titanium-sapphire laser, CO laser or $CO_2$ laser.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming an n-type well and a p-type well on a semiconductor substrate;

enclosing upper ends of the n-type well and the p-type well with an isolation film;

forming a gate insulating film on the n-type well and the p-type well enclosed with the isolation film;

forming gate electrodes on the gate insulating film of the n-type well and the p- type well;

forming first sidewall insulating films on the sidewalls of the gate electrodes;

forming a first source/drain region and a second source/drain region on upper surfaces of the n-type well and the p-type well by ion-implanting p-type impurities and n-type impurities, respectively, using the gate electrodes and the first sidewall insulating films as masks;

ion-implanting the n-type impurities into the p-type well while masking the n-type well with a first film after removing the first sidewall insulating films in order to form a first source/drain extension region shallower than the first source/drain region and to implant the n-type impurities into the gate electrodes of the p-type well;

carrying out first annealing having a first temperature increase/decrease rate after removing the first film in order to diffuse the p-type impurities and the n-type impurities to bottoms of the gate electrodes;

masking the p-type well with a second film and ion-implanting the p-type impurities into the n-type well after carrying out the first annealing in order to form a second source/drain extension region shallower than the second source/drain region; and carrying out, after removing the second film, second annealing having a second temperature increase/decrease rate higher than the first temperature increase/decrease rate after removing the second film in order to activate the p-type impurities and the n-type impurities implanted in the gate electrodes, the first and second source/drain regions and the first and second source/drain extension regions, while suppressing diffusion of the p-type impurities from the second source/drain region and the second source/drain extension region.

2. The method according to claim 1, wherein said forming the gate insulating film includes using a silicon oxide film or a silicon oxynitride film.

3. The method according to claim 2, wherein the gate insulating film includes a silicon oxynitride film, and the concentration of nitrogen in the surface of the silicon oxynitride film is 15% or less.

4. The method according to claim 1, wherein said forming the gate electrodes includes using polysilicon or polysilicon germanium.

5. The method according to claim 4, wherein the gate electrode includes polysilicon germanium, and a concentration of germanium in the polysilicon germanium is 10% or more and 30% or less.

6. The method according to claim 1, wherein said carrying out the first annealing includes annealing at a first temperature increase/decrease rate of 100° C./second or more and at a maximum attained temperature of 900° C. or more and 1050° C. or less.

7. The method according to claim 1, wherein said carrying out the second annealing includes annealing at a second temperature increase/decrease rate of $10^5$° C./second or more and at a maximum attained temperature of 1100° C. or more and 1400° C. or less.

8. The method according to claim 1, wherein said carrying out the second annealing includes using a light source in which the full width at half maximum of a light emission pulse is 0.1 ms or more and 100 ms or less.

9. The method according to claim 8, wherein the light emission pulse is emitted only once.

10. The method according to claim 8, wherein the light source is a flash lamp including one selected from the group consisting of an inert gas, mercury and hydrogen.

11. The method according to claim 8, wherein the light source is one selected from the group consisting of an arc discharge lamp, excimer laser, Ar laser, $N_2$ laser, YAG laser, titanium-sapphire laser, CO laser and $CO_2$ laser.

12. The method according to claim 1, wherein said carrying out the second annealing includes auxiliary heating from a rear surface of the semiconductor substrate.

13. The method according to claim 12, wherein the auxiliary heating is carried out at 400° C. or more and 900° C. or less.

14. The method according to claim 12, wherein the auxiliary heating is performed with use of one selected from the group consisting of a hot plate, a halogen lamp and an arc lamp.

15. The method according to claim 1, further comprising forming an overcoat insulating film over the silicon substrate and the gate electrodes after said carrying out first annealing, wherein the second annealing is carried out with the overcoat insulating film.

16. The method according to claim 15, wherein the overcoat insulating film includes a silicon oxide film and a silicon nitride film.

17. The method according to claim 1, wherein the n-type impurities include As and the p-type impurities include B.

18. The method according to claim 1, wherein said carrying out first annealing includes eliminating crystal defects in a region where the n-type impurities are ion-implanted.

* * * * *